United States Patent [19]

Lumbard

[11] Patent Number: 5,311,407
[45] Date of Patent: May 10, 1994

[54] PRINTED CIRCUIT BASED FOR MOUNTED SEMICONDUCTORS AND OTHER ELECTRONIC COMPONENTS

[75] Inventor: Marvin Lumbard, Los Gatos, Calif.

[73] Assignee: Siemens Components, Inc., Iselin, N.J.

[21] Appl. No.: 876,640

[22] Filed: Apr. 30, 1992

[51] Int. Cl.⁵ .............................................. H01L 23/02
[52] U.S. Cl. ..................... 361/813; 361/777; 257/676; 257/723; 174/52.4
[58] Field of Search ............... 361/396, 412, 414, 421, 361/415; 257/666, 668, 675, 676, 685, 686, 723, 724; 174/52.4

[56] References Cited

U.S. PATENT DOCUMENTS

| | | | |
|---|---|---|---|
| 4,305,204 | 12/1981 | Toggart et al. | 29/841 |
| 4,649,461 | 3/1987 | Matsuta | 361/414 |
| 4,677,528 | 6/1987 | Miniet | 361/414 |
| 4,725,920 | 2/1988 | Ijichi et al. | 361/414 |
| 4,763,188 | 8/1988 | Johnson | 361/415 |
| 4,908,933 | 3/1990 | Sagisaka et al. | 29/827 |

Primary Examiner—Gary F. Paumen
Attorney, Agent, or Firm—Joseph S. Codispoti

[57] ABSTRACT

An improved printed circuit board (PCB) for interconnecting integrated circuit devices includes a lead frame sandwiched between two multilayer substrates. Integrated circuit devices are mounted on the top of the upper substrate and on the bottom of the lower substrate to provide increased packaging density. Thus, according to the present invention, it is possible to provide a simply constructed electronic component mounting PCB which facilitates the design of circuits, and affords excellent connection reliability, which can readily form a heat radiating structure, and in which the thermal matching with the electronic component is excellent.

14 Claims, 9 Drawing Sheets

PRINTED CIRCUIT BASED FOR MOUNTED SEMICONDUCTORS AND OTHER ELECTRONIC COMPONENTS

BACKGROUND OF THE INVENTION

1. Field of the Invention

The present invention relates generally to printed circuit boards, and more particularly, to a method of manufacturing a substrate for mounting electronic components. More specifically, the present invention relates to a method of manufacturing a low cost printed circuit board (PCB) substrate having an integrated leadframe and a heatsink such that the connection portions of electronic components are mounted on the substrate and the corresponding leads protruding from the substrate are electrically connected. This invention also relates to semiconductor devices, and more particularly to a multi-device semiconductor component.

2. Background of the Invention

Electronic components are typically packaged on a printed circuit board. Therefore, electronic component mounting printed circuit boards in various forms have been developed and proposed.

There is, for example, the so-called DIP (Dual In-line Package) type of connection for connecting electronic components and terminals to external connections, such as leads, in a printed circuit board. In the DIP connection a plurality of leads electrically independent of one another are protruded from a base member and the respective leads and the connection portions of the electronic components mounted on the base member are electrically connected.

With the increasing complexity and miniaturization of present day electronic apparatus, an increasing demand has developed for densely packaged integrated circuit devices. This demand has exceeded the ability of semiconductor manufacturers to deliver specific monolithic solutions, thus creating a pressing need for a PCB whereby a number of integrated circuit devices can be interconnected on a single substrate. The present invention meets this requirement and combines a plurality of individual integrated circuit devices on a single substrate which is mechanically compatible with previous generations of semiconductor packages to take advantage of existing automatic manufacturing and assembly techniques.

Various techniques for the interconnection of individual semiconductor devices in high density applications have been developed. One technique, which is described in U.S. Pat. No. 4,305,204 and illustrated in FIG. 1, utilizes LED 33 (Light Emitting Diode) chip arrays which form alpha-numeric characters on the top side of a PCB substrate 11 and a CMOS decoder/driver chip 44 on the bottom side between the dual in-line leads 55. The LED 33 and the chip 44 are encapsulated in a transparent plastic housing 77 having a transparent epoxy 88, thus forming a transparent, dual in-line lead LED Package.

Figure 2:
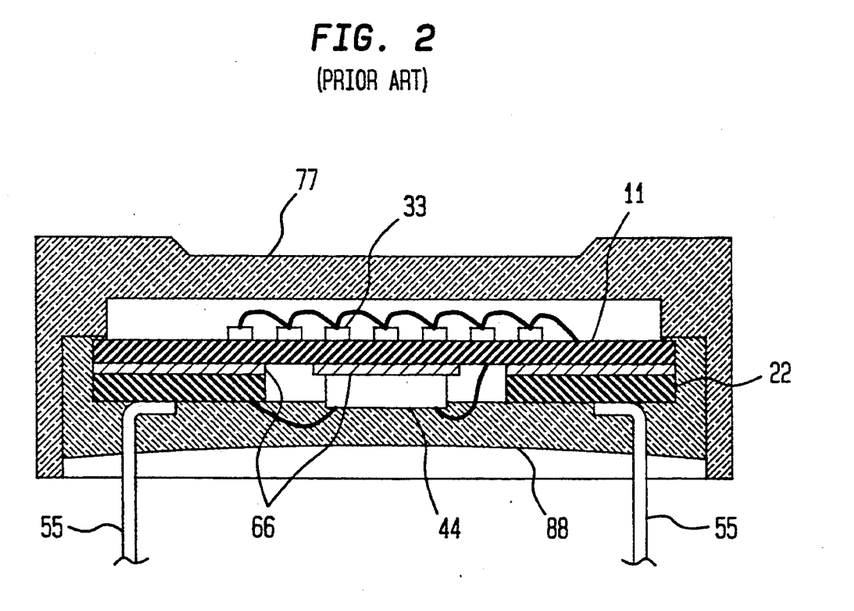
FIG. 2 is a schematic perspective view showing another prior electronic component mounting circuit board.

Another technique, shown in FIG. 2, utilizes an etched copper heatsink 66 (0.012 inch thick) laminated between two double sided PCBs 11 and 22. The LED arrays 33 are mounted on the top side of the top PCB 11 and the decoder/driver chip 44 is mounted on heatsink 66 through a cavity formed in the bottom PCB 22. The leads 55 are subsequently soldered to the bottom side of the bottom PCB 22. The above-formed structure is encapsulated in a transparent housing 77.

Figure 1:
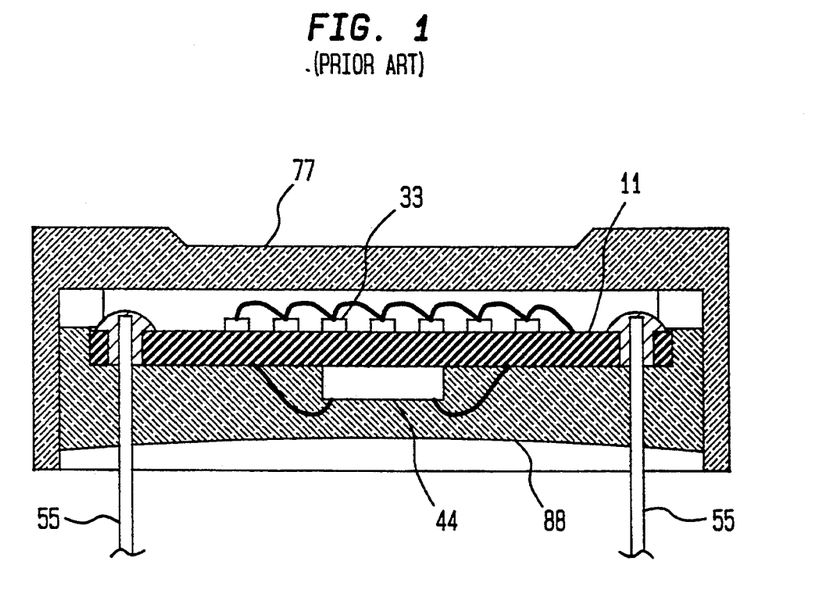
FIG. 1 is a schematic perspective view showing a prior electronic component mounting circuit board.

A disadvantage with the techniques shown in FIGS. 1 and 2 is that they are not capable of being fully automated and thus are undesirably expensive.

SUMMARY OF THE INVENTION

Accordingly, it is a general object of the invention to provide a new and improved construction for a printed circuit board (PCB).

It is a more specific object of the invention to provide a multi-device semiconductor component of greater density and of conventional lead configuration.

It is a further object of the present invention to provide a PCB having improved heat dissipation, reduced cross-talk and improved reliability.

It is a still further object of the present invention to provide a PCB substrate which can be readily and economically manufactured by known manufacturing techniques.

It is yet another object to provide the features and advantages of the invention using a minimum number of operations so that the full economic benefit of the printed circuit board substrate is realized consistent with current manufacturing processes whose major attributes are low cost packaging and reliable assembly techniques.

Another object of the present invention is to provide a simply constructed electronic component mounting circuit board which facilitates circuit design, dispenses with the through hole plating for electrical interconnection and affords excellent connection reliability, can readily form a heat radiating structure, and has excellent thermal matching with the electronic components.

Accordingly, the present invention provides a circuit board for mounting electronic components wherein the circuit board comprises a substrate and several metal members. The substrate includes at least one inner PCB and an outer PCB on which the electronic components are mounted. The metal members are electrically independent of one another and protrude from the substrate. Each metal member includes a lead and an internal connection portion unitarily formed with the lead. Electrical connection between the inner and outer PCBs are made by either a double solder tab, wirebonding or a small piece of wire soldered to the plated through holes in the PCBs. The circuit board further comprises conductor circuits between the PCBs.

Various means employed by the present invention will be described in detail according to the embodiments thereof illustrated in the drawings.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 10 is an exploded perspective view of the principal elements of the semiconductor component of FIG. 7a;

DETAILED DESCRIPTION OF THE PREFERRED EMBODIMENTS

To facilitate a full and complete understanding of the invention, a conventional technique, which is described in U.S. Pat. No. 4,908,933, will be reviewed first. Thereafter, the printed circuit board manufactured in accordance with the teachings of the present invention will be described.

Figure 4:
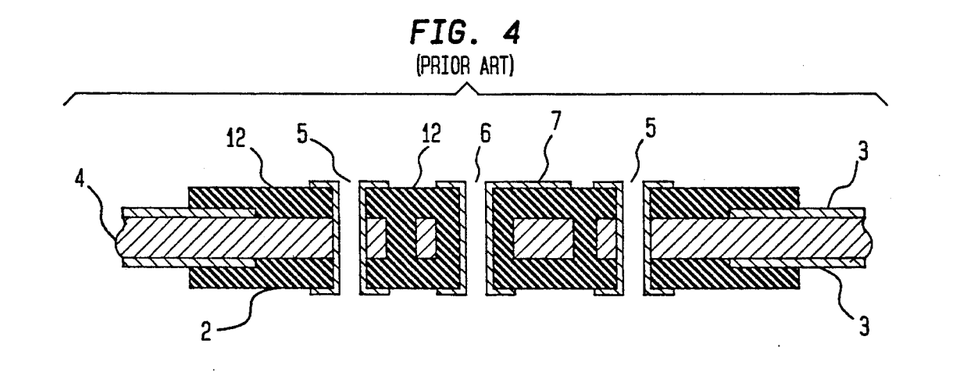

FIG. 4 is a sectional view of a substrate for mounting electronic components performed according to the conventional method. In FIG. 4, reference numeral 4 denotes a lead frame, which is generally made of 42-alloy or copper but is not particularly limited as it may be made of any material that is adapted for its use or object. The lead frame 4 is processed by etching, stamping, drilling or a combination thereof. More specifically, clearance for obtaining insulation of a through hole 6 necessary to form a conductor circuit on the substrate to the lead frame 1 is provided. In other words, a hole (hereinafter referred to as "primary hole 9") having a diameter larger than that of the through hole 6 is formed, and, if need be, the formation of islands 12 and holes necessary for conveying and positioning can be carried out.

Then, a mask (hereinafter referred to as "outer lead mask 3", which is necessary on all portions of lead frame material to have their surfaces exposed when the substrate for mounting electronic components is completed) is formed on a portion to be electrically connected to at least an exterior of the lead frame 4. This step of forming the outer lead mask 3 is provided to prevent an outer lead of lead frame 4 from directly contacting a prepreg, resin or both (hereinafter referred to as "prepreg 2") to bond the prepreg or the like onto the outer layer lead in the next step of forming a resin layer.

Since the prepreg or the like is not only for bonding the lead frame 4 to a copper foil 1 through the prepreg 2, but also for filling up the primary hole 9 with resin, in the next step of forming a resin layer, a suitable flowability and quantity of resin is required. Accordingly, two or three sheets of 0.1 mm thick prepreg, for example, are employed, and the resin content of the prepreg is increased, or resin is further added in addition to the prepreg as required.

On the other hand, the outer lead mask can be made of metals such as copper, aluminum, stainless steel, etc., resins such as polyimide, fluorine, silicon, polyphenylene sulfide, polyether etherketon, etc. or composite materials thereof, and is not limited thereto if the material chosen can attain the object of a mask at the temperature and pressure generated in the next step of forming the resin layer, i.e., if it can prevent the resin from bonding to the surface of the outer lead. Further, in the method of processing and forming the outer lead mask, mechanical working, such as etching, and drilling, together with photosensitive resin are employed.

Figure 3:
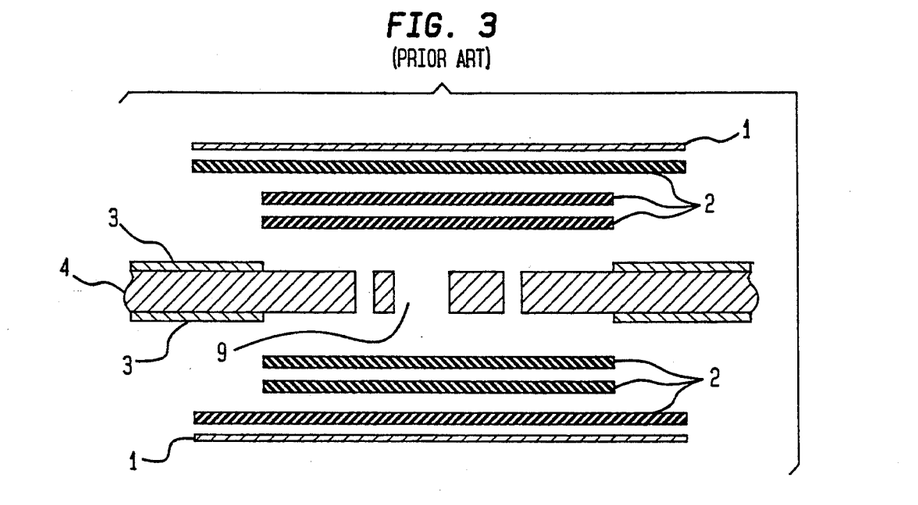
FIGS. 3 to 5 are sectional views exemplifying various steps of a prior method of manufacturing a PCB substrate.

Next, prepregs 2 and, as required, copper foils 1 are disposed on both side surfaces of the lead frame 4 under the conditions determined by the pressure, temperature and time and the like adapted for curing the prepreg 2 used and filling up the primary hole 9 (FIG. 3), the formation of a resin layer being carried out after alignment. Thereafter, holes are opened by a normal drilling method (through hole 6 for forming a conductor circuit on the substrate, through hole 5 for electrically connecting the electronic components to the lead frame, and any holes necessary to position other components) (FIG. 4), through hole plating is performed, and, as required, etching, Ni-Au plating, solder resist, solder-coating, etc. are further carried out.

Then, in order to remove the outer lead mask, the prepregs 2 and the like are removed. The method used here is mechanical working, etching, a combination thereof or the like. Accordingly, the depth accuracy in the step of removing the resin layer on the outer lead mask, for example, by mechanical working is very important. This is because it must be performed without damaging the surface of the outer lead and the prepreg and the like must be almost totally removed.

Figure 5:
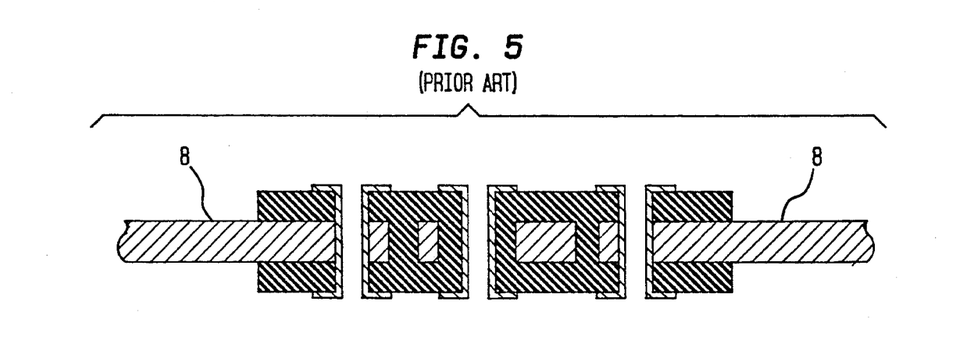
Figure 6:
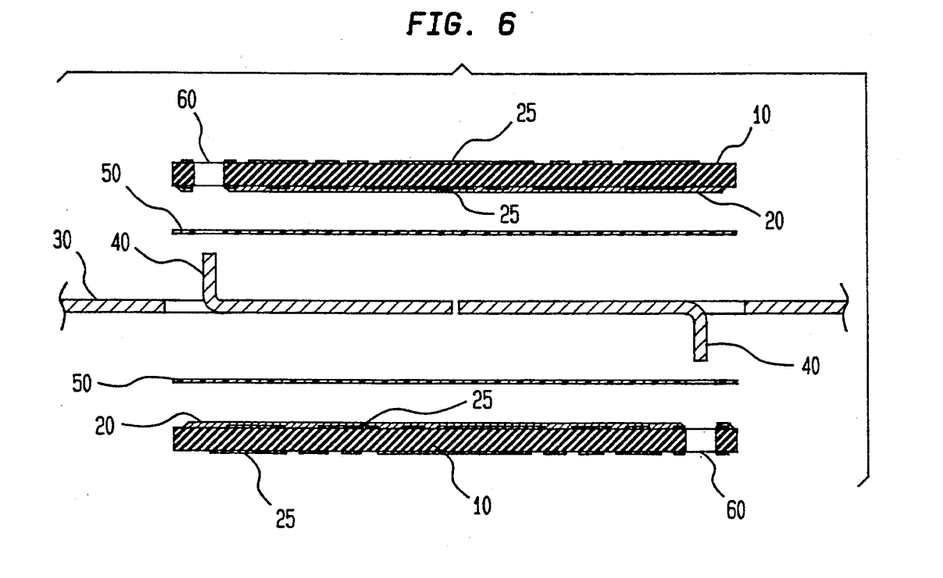
FIGS. 6, 7a, and 7b are sectional views showing representative examples of a substrate for mounting electronic components according to the present invention.

After this, the outer lead mask is removed to complete a substrate for mounting electronic components as shown in FIG. 5.

Thereafter, electronic components are placed and connected on the substrate for mounting electronic components, and since the outer leads are secured by the prepreg or the like, potting is used as a sealing configuration, or a transfer molding may also be employed.

To sum up, in the above-described conventional technique, multiple layers of copper foil prepreg resin 2 and masking layers 3 are provided on a leadframe 4 to form a composite sandwich. Through holes are drilled into the leadframe leads 5 and in the leadframe 6. After the drilling operation, the composite sandwich is plated with copper which forms plated through holes, wherein some of the plated through holes make electrical contact with the leadframe leads 5 while the remaining plated through holes are used for interconnecting the top layer to the bottom layer. An etching resist mask is then selectively applied to the composite sandwich. The unwanted copper is etched away leaving the plated through holes intact. The masking layer 3 is stripped away using a combination of mechanical abrasion and etching techniques, thus exposing the leads 8.

With the aforementioned basic construction, however, the following problems which must be solved arise in implementing reliable high-density packaging which is particularly required of a variety of electronic component mounting circuit boards in recent years:

(1) In general, an electronic component generates heat when energized, and this heat must be dissipated to the exterior. Nevertheless, in the electronic component mounting circuit board of the prior art described before, a metal member located underneath the electronic component is not joined with other metal portions but is embedded in the base member. Therefore, even though the metal member is in the circuit board and is an excellent thermal conductor, it cannot be positively utilized as a heat radiating member.

(2) The lamination process is undesirably slow and takes a long time. Additionally, microscopic voids can easily be left in the lamination process, resulting in short circuits in the leadframe during plating. Accordingly, reliability in the design of a PCB becomes very low.

(3) In the through hole plating technique, the dissimilar materials with dissimilar coefficients of thermal expansion, make it difficult to obtain a reliable electrical connection between the traces on the substrate and the leadframe using electroplating methods.

(4) A combination of mechanical abrasion and acid etching techniques is used for stripping the prepreg resin and the leadframe mask off the leads. If too little stripping is performed the leads are not electrically conductive. If too much stripping is performed the leads plated are scratched and damaged. Therefore, inexpensive and reliable packaging is difficult to obtain.

The present invention is described below in detail with reference to embodiments shown in the accompanying drawings.

Referring to the figures, and particularly to FIGS. 6, 7a, 7b and 10, two standard technology double sided etched copper, gold plated PCBs 10 are coated with a standard soldermask 20 to prevent short circuits in the leadframe, in accordance with the invention. The copper in each PCB 10 is etched to form a metal circuit pattern 25 and gold plated to provide necessary connections between semiconductor chips. The conductive metals may be disposed on one or both sides of PCBs 10. The leadframe 30 is manufactured by stamping or etching and is seen to generally comprise short solder tabs 40 which are pre-bent and inserted through the clearance holes in the prepreg 50.

The plated through PCB connection holes 60 are aligned over the solder tabs 40. Next, the entire assembly is inserted in a fixture or a press which applies even pressure and heat over the substrate, thus laminating the PCBs, prepreg and leadframe together. The solder tabs 40 are soldered to the PCB connection holes 60 with a suitable solder 70.

Figure 7A:
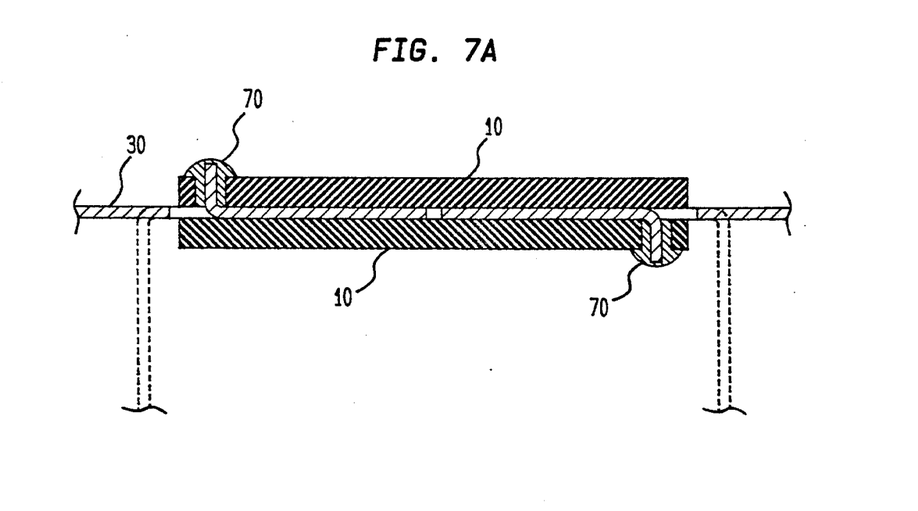

Referring to FIG. 7a, according to a first embodiment of the invention, the completed substrate is electrically connected to the leads with some of the leads connected on the top PCB and some of the leads connected to the bottom PCB.

Figure 7B:
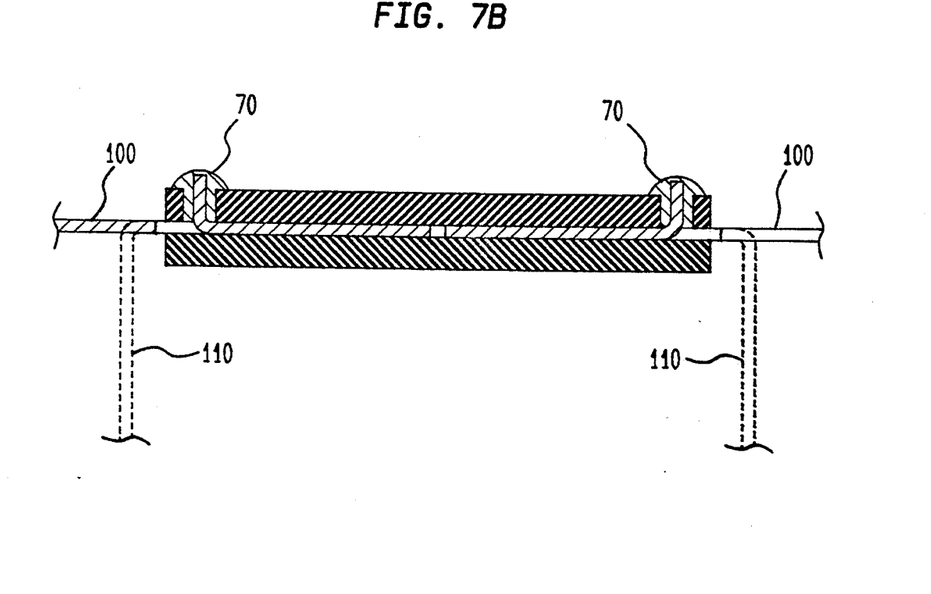

In a second embodiment of the invention, as shown in FIG. 7b, all of the leads are connected to either the top side or the bottom side of the PCB.

Preferably, the leads are left flat for transfer molding operations 100. However, the leads can be bent at an angle of 90 degrees for encapsulated or hybrid packages 110.

Figure 9:
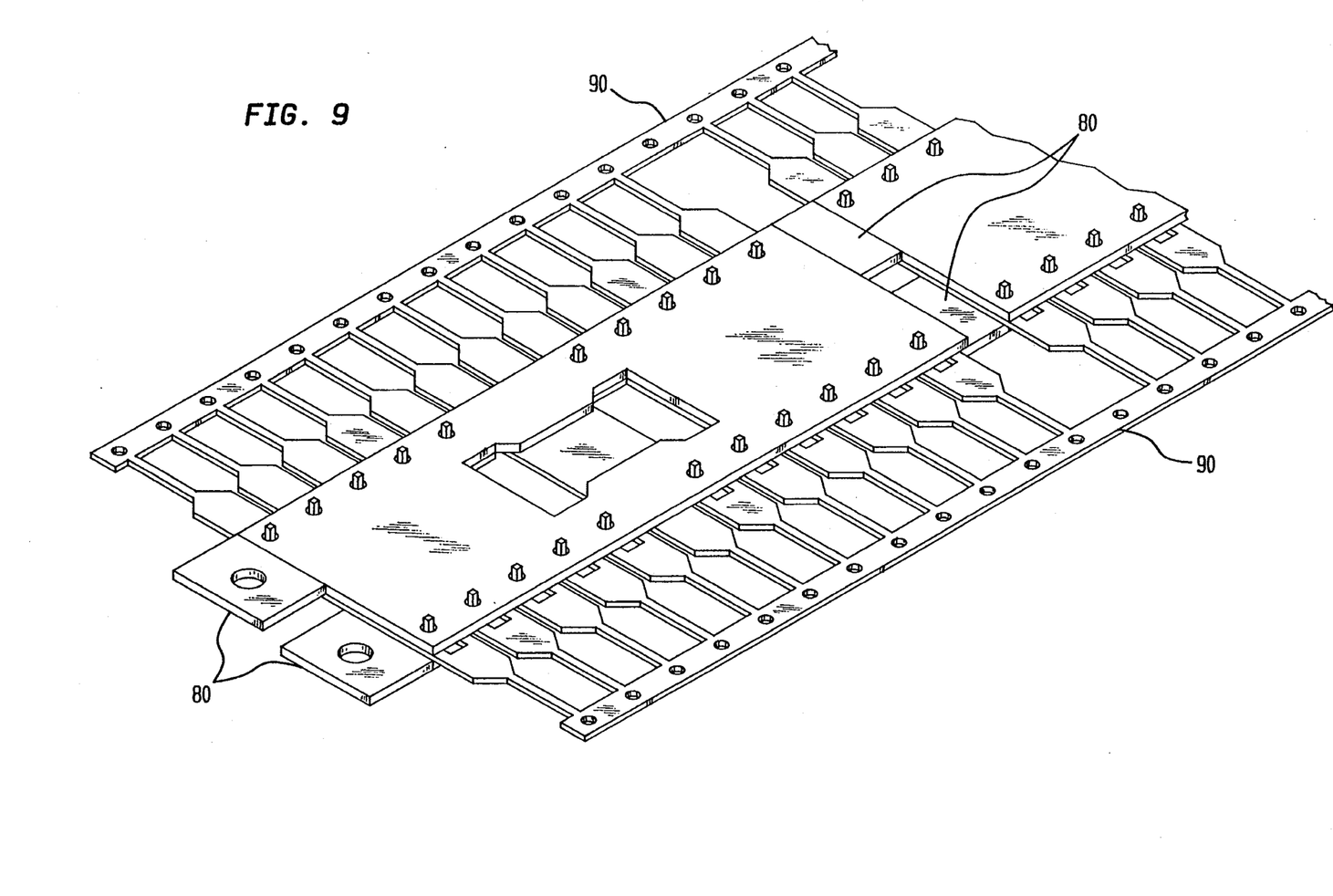
FIGS. 9 and 11 are top plan views of the multi-device semiconductor component showing the interconnections between individual semiconductor devices and the substrate of the module.

Next, referring to FIG. 9, if the substrates are built in a strip form, the substrates are singulated by removing the PCB bridging area 80 with preferably a punch, saw, or router, thereby leaving the leadframe side rails 90 intact.

Figure 8:
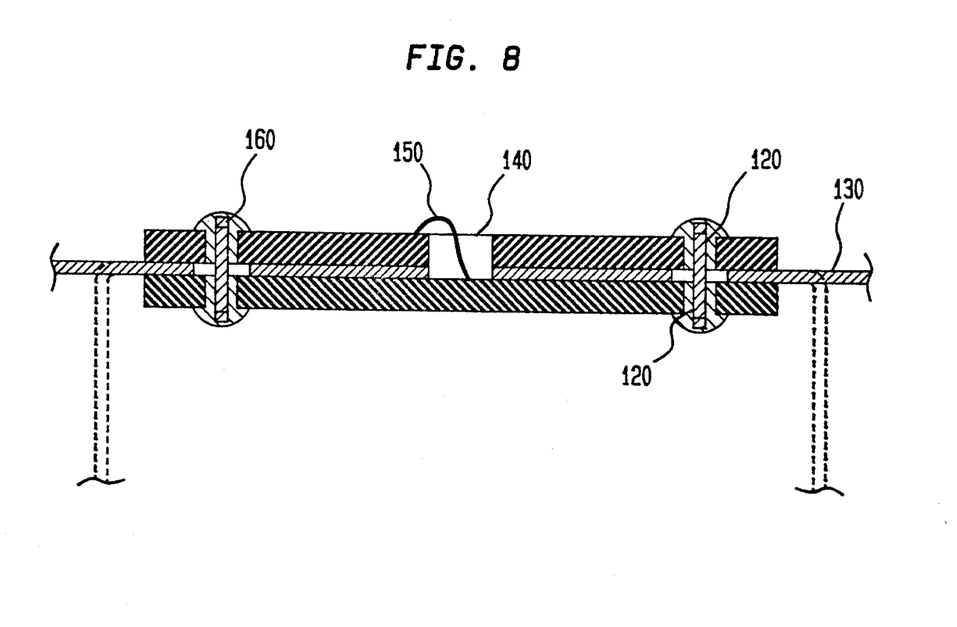
FIG. 8 is another sectional view of the circuit board of the present invention.

Electrical connections are established between the two PCBs, with one of the three techniques shown in FIG. 8 and described below.

First, a double solder tab is used with one tab formed up and one tab formed down 120. The two leadframe tabs are branched off from the same metal lead 130. The lead is either available for external connections or provided as a "dummy" lead which is removed by a punching process during singulation.

Secondly, a clearance hole or "well" is left in one of the two PCBs, the prepreg and the leadframe 140. The electrical connection is made by wirebonding from the first PCB to the second PCB 150.

Thirdly, a small piece of wire is soldered to plated through holes in both PCBs 160. Additionally, a large clearance hold is left in the leadframe to prevent short circuits.

Figure 10:
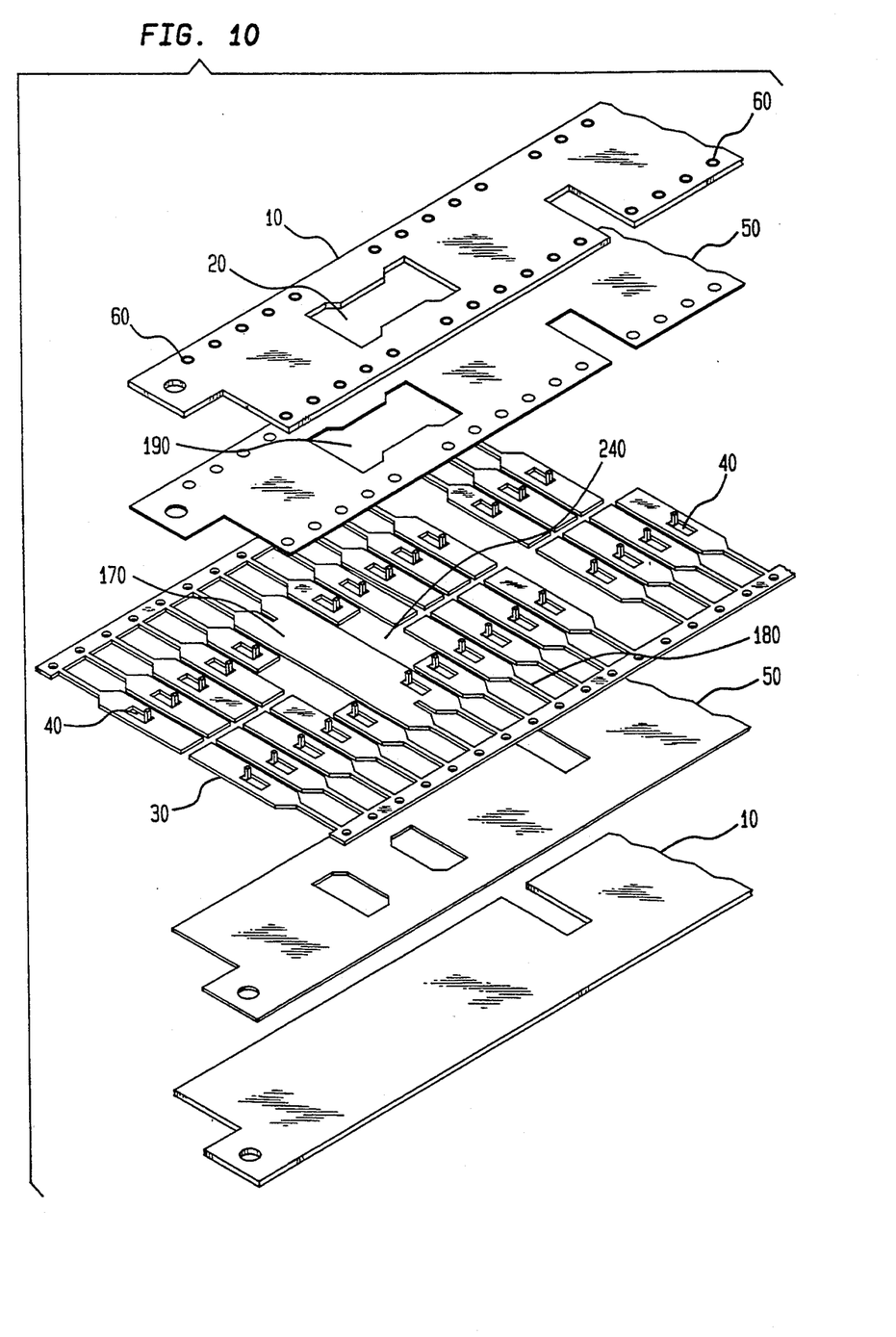
Figure 12:
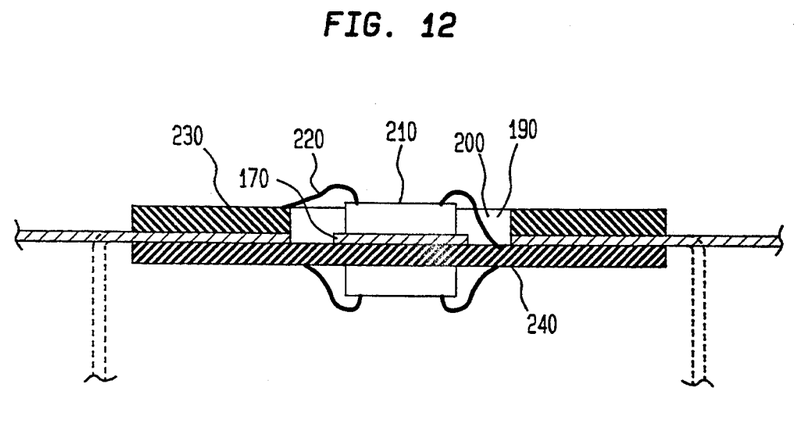
FIGS. 12 and 13 are sectional views of the circuit board of the present invention.

The metal leadframe members provided on the inside and outside surfaces of the substrate, in addition to serving the conventional interconnect function, serves as a heat sink for the semiconductor chips 210. As shown in FIGS. 10 and 12, a die attach pad 170 is provided in the leadframe and connected to one or more leads 180. An opening is pre-routed or punched in the PCB 200 and in the prepreg 190. After lamination, an opening is left in the substrate exposing the heatsink die attach pad 170. An integrated circuit or other semiconductor chip 210 is attached to the heatsink using known semiconductor procedures. The wirebonds 220 are bonded from the chip to the first PCB 230 or from the chip through a relief in the leadframe to the lower PCB 240. Consequently, heat transmitted from the semiconductor devices is conducted to the leadframe, which serves as a heat dissipating element.

Figure 11:
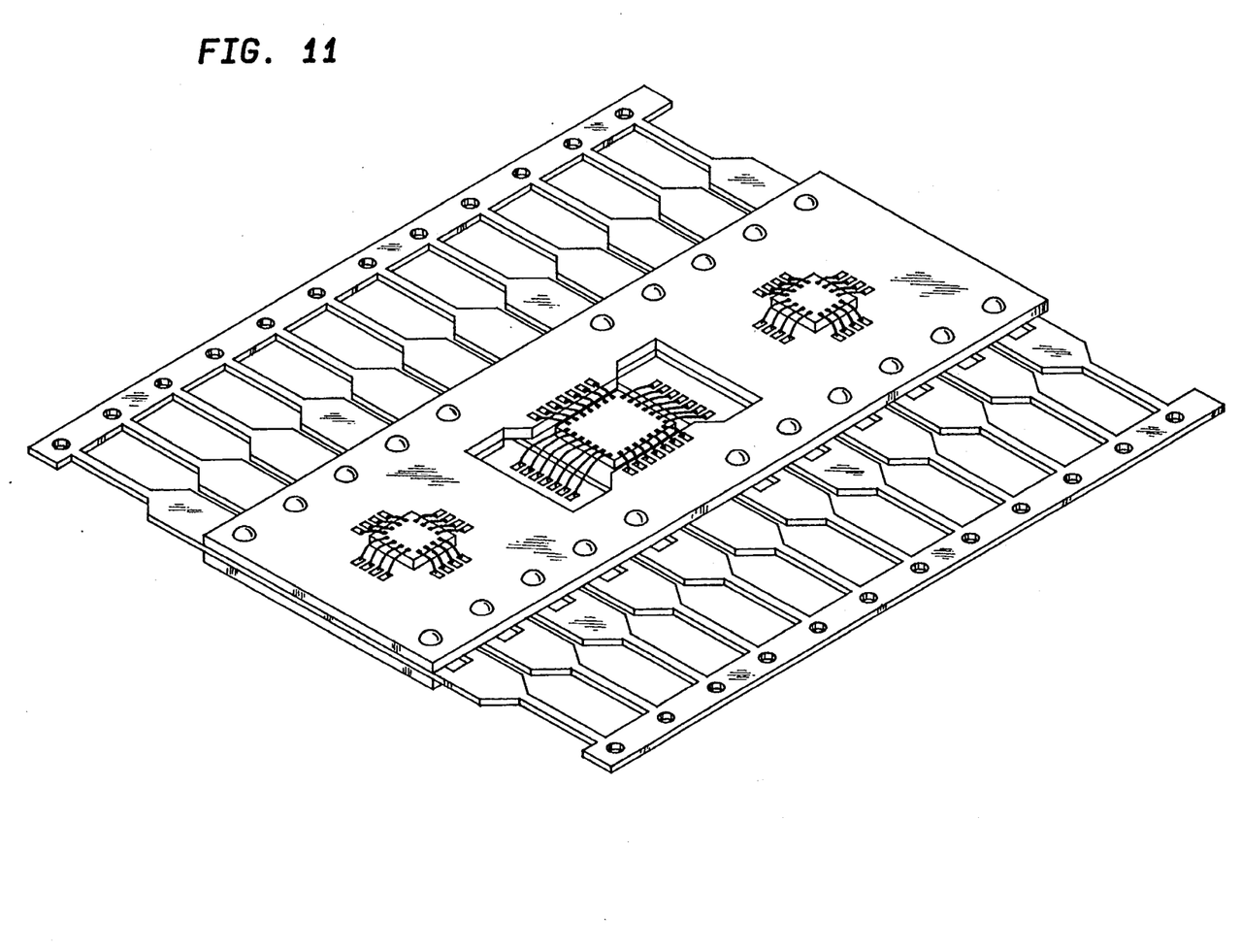
Figure 13:
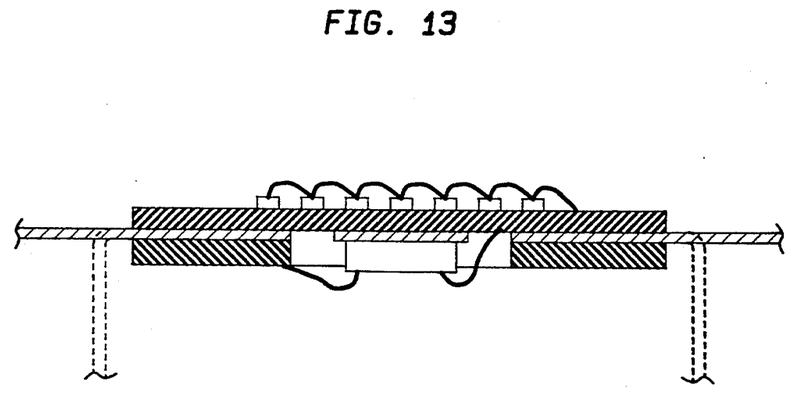

FIGS. 11, 12 and 13 show various contemplated applications of the PCB substrate manufactured according to the teachings of the invention.

Figure 14:
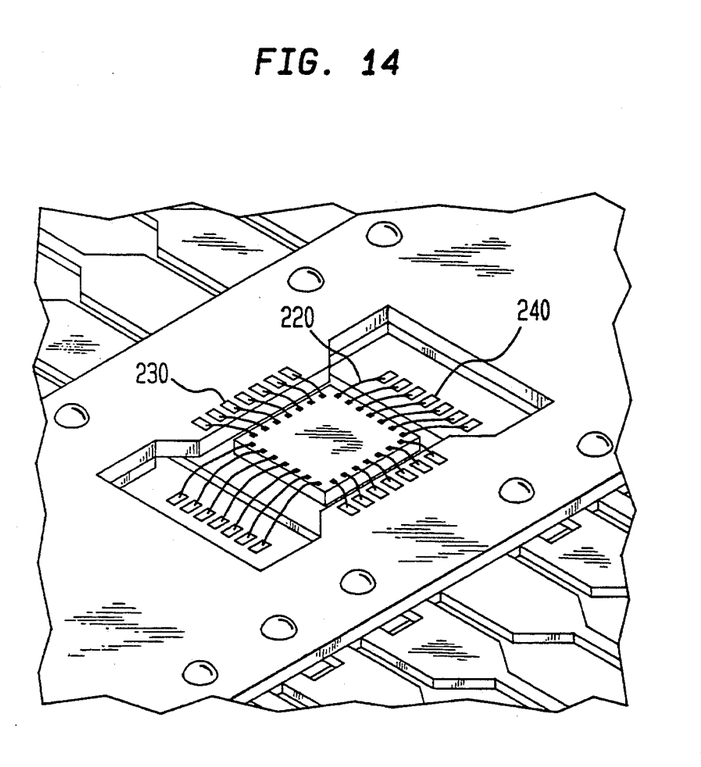
FIG. 14 is a top plan view of the printed circuit board substrate showing the interconnections between the semiconductor device on the printed circuit board substrate.

In FIGS. 11 and 14 multiple semiconductor chips are attached to the top side of the substrate. The center chip is mounted to the heatsink/leadframe with the wirebonds bonding both top and bottom PCBs.

As shown in FIG. 12, semiconductor chips are mounted on both sides of the substrate with one of the chips attached to the heatsink/leadframe. Individual semiconductor devices 210 may thus be provided on the outside (top) surface of the substrate, and a second plurality of individual semiconductor devices may be provided on the inside (bottom) surface of the substrate. By reason of the unique mechanical and electrical interconnections provided between the devices, the component has an electrical capability substantially greater than could ordinarily be provided in the area occupied by the component on an underlying PCB.

Referring to FIG. 13, LED (Light Emitting Diode display) arrays are mounted to the top side of the substrate and the semiconductor chip is mounted on the back side to the exposed heatsink/leadframe. The wirebonds from the semiconductor chip are bonded to the top and the bottom PCBs. It will be appreciated that various types of semiconductor devices may be incorporated in other applications.

To sum up, in accordance with the present invention, it is possible to provide a simply constructed electronic component mounting printed circuit board which facilitates the design of a circuit, which dispenses with the slow lamination process, unreliable through hole plating techniques, and complex mechanical abrasion and etching techniques; and affords excellent connection reliability economically, which can readily form a heat radiating structure, and provides multi-level semiconductor placement on the PCB.

While the invention has been described in detail with reference to the preferred embodiment thereof, it will be apparent to one skilled in the art that various changes and modifications can be made therein without departing from the spirit and scope thereof. The present invention is only limited by the claims appended hereto.

What is claimed is:

1. A printed circuit board, comprising:

a first substrate having inside and outside surfaces, a plurality of plated through holes defined therein, a first metalization layer formed a first electrical interconnection on said outside surface, at least one electronic component including a plurality of electrical contacts for establishing electrical connection therewith, and first electrical interconnection means for connecting said contacts with said first electrical interconnection;

a second substrate having inside and outside surfaces, a plurality of plated through holes defined therein, a second metalization layer forming a second electrical interconnection for said components on said outside surface, and at least one electronic component mounted on said outside surface and including a plurality of electrical contacts for establishing electrical communication therewith, and second electrical interconnection means for connecting said contacts with said second electrical interconnection;

a lead frame including a plurality of leads each having a proximal end and a distal end, proximal ends of said leads being arranged in generally opposed pairs, each including a generally planar interior portion disposed between and engaged by said inside surfaces of said substrates and a solder tab which protrudes from and is electrically connected to one of said plurality of plated through holes, whereby said leads are fixedly positioned relative to said substrates, distal ends of said leads being disposed outside of said substrate arrangement for establishing external electrical connections to said leads; and bonding means for securing said substrates on either side of said interior portions of said proximal ends.

2. A printed circuit board as defined in claim 1 wherein at least one of said first and second interconnection means comprises a plurality of wire bonds.

3. A printed circuit board as defined in claim 1 wherein said first substrate includes at least a first pair of electronic components mounted on said outside surface, and said first electrical interconnection means interconnect the electrical contacts of said electronic components with said first electrical interconnection.

4. A printed circuit board as defined in claim 3 wherein said second substrate includes at least a second pair of electronic components mounted on said outside surface, and said second electrical interconnection means interconnect the electrical contacts of said electronic components with said second electrical interconnection.

5. A printed circuit board as defined in claim 1 wherein at least one of said interconnection means comprises a solder tab.

6. A printed circuit board as defined in claim 1 wherein said electronic components are Light Emitting Diodes.

7. A printed circuit board as defined in claim 1 wherein said electronic components are individually mounted on one of said outside surfaces.

8. A multi-device semiconductor component, comprising:

a first substrate having an inside surface and an outside surface;

first metalization layers on said inside and outside surfaces of said first substrate forming a first electrical interconnection for devices on said outside surface of said first substrate;

first and second semiconductor devices mounted on said outside surface of said first substrate, each of said devices including a plurality of electrical contacts for establishing electrical communication therewith;

first electrical interconnection means for connecting said electrical contacts of said first and second devices with said first interconnection to establish electrical communication between said first and second devices and said first interconnection;

a second substrate having an inside surface and an outside surface;

second metalization layers on said inside and outside surfaces of said second substrate forming a second electrical interconnection on said outside surface of said second substrate;

third and fourth semiconductor devices mounted on said outside surface of said second substrate, each of said devices including a plurality of electrical contacts for establishing electrical communication therewith;

second electrical intercommunication means for connecting said electrical contacts of said third and fourth devices with said second interconnection to establish electrical communication between said third and fourth devices and said second interconnection;

a lead frame including a plurality of leads each having a proximate end and a distal end, said proximate ends of said leads being arranged in generally opposed pairs in a generally planar configuration and each including an interior portion disposed between and engaged by said inside surfaces of said substrates whereby said leads are fixedly positioned relative to said substrates, and an exterior portion disposed outside of said substrate arrangement for establishing electrical connections to said leads;

bonding means for securing said substrates on either side of said interior portions of said proximate lead ends; and connection means for electrically interconnecting said exterior portions of said proximate lead ends with said first and second electrical interconnections whereby said first, second, third, and fourth semiconductor devices are electrically interconnected and electrically accessible through said leads.

9. A multi-device semiconductor component as defined in claim 8 wherein said connection means comprise a plurality of wire segments.

10. A multi-device semiconductor component as defined in claim 9 wherein said interconnection means comprise a double solder tab.

11. A printed circuit board comprising:

a first substrate;

a plurality of first electronic circuit devices connected by bonded wires to an array of conductive leads on said first substrate;

a second substrate;

a plurality of second electronic circuit devices connected by bonded wires to an array of conductive leads on said second substrate; and a lead frame connected between said first and second substrates, said lead frame having leads which pass through said first and second substrates and which are connected to said conductive leads.

12. A printed circuit board for mounting at least one electronic component, the circuit board comprising:
   an assembly, including at least one inner substrate and an outer substrate defining an opening in which the at least one electronic component is mounted and a plurality of plated through holes which are disposed about said opening;
   a plurality of metal members which are electrically independent of one another, each metal member including an external lead, an internal connection portion, and a solder tab, said external lead, internal connection portion and solder tab being unitarily formed, said internal connection portions being disposed between said inner and outer substrates, and said solder tabs protruding into said plated through holes in said outer substrate; and
   conductor circuits between said at least one electronic component and said inner and outer substrates, said conductor circuits extending through the opening in said outer substrate to connect with said inner substrate.

13. A printed circuit board for mounting at least one electronic component as defined in claim 12 wherein said internal connection portions of said respective leads are arranged in generally opposed pairs which are coplanar.

14. A printed circuit board for mounting at least one electronic component as defined in claim 13, further comprising a heat sink formed on a die attach pad connected to said metal members.

* * * * *

UNITED STATES PATENT AND TRADEMARK OFFICE
CERTIFICATE OF CORRECTION

PATENT NO. : 5,311,407
DATED : May 10, 1994
INVENTOR(S) : Lumbard

It is certified that error appears in the above-indentified patent and that said Letters Patent is hereby corrected as shown below:

Title page, item [54] and col. 1, delete the title in its entirely and in its place insert-- PRINTED CIRCUIT BOARD FOR MOUNTING SEMICONDUCTORS AND OTHER ELECTRONIC COMPONENTS--.

Signed and Sealed this

Ninth Day of April, 1996

Attest:

BRUCE LEHMAN

Attesting Officer     Commissioner of Patents and Trademarks